US012749654B2

(12) United States Patent
Li et al.

(10) Patent No.: US 12,749,654 B2
(45) Date of Patent: Sep. 29, 2026

(54) SEMICONDUCTOR PROCESSING EQUIPMENT AND IMPEDANCE-MATCHING METHOD

(71) Applicant: BEIJING NAURA MICROELECTRONICS EQUIPMENT CO., LTD., Beijing (CN)

(72) Inventors: Wenqing Li, Beijing (CN); Gang Wei, Beijing (CN); Jing Yang, Beijing (CN); Shuqi Jiang, Beijing (CN); Di Zhang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 5 days.

(21) Appl. No.: 18/621,881

(22) Filed: Mar. 29, 2024

(65) Prior Publication Data

US 2024/0249917 A1 Jul. 25, 2024

Related U.S. Application Data

(63) Continuation of application No. PCT/CN2022/122085, filed on Sep. 28, 2022.

(30) Foreign Application Priority Data

Sep. 30, 2021 (CN) .......................... 202111160966.8

(51) Int. Cl.
*H01J 37/32* (2006.01)
*H03H 7/38* (2006.01)
*H10P 74/00* (2026.01)

(52) U.S. Cl.
CPC ......... *H01J 37/32183* (2013.01); *H03H 7/38* (2013.01); *H10P 74/23* (2026.01); *H01J 2237/327* (2013.01)

(58) Field of Classification Search
CPC ....... H01J 37/32183; H01L 22/20; H03H 7/38
See application file for complete search history.

(56) References Cited

U.S. PATENT DOCUMENTS 5,982,099 A 11/1999 Barnes et al.
2002/0038632 A1 4/2002 Shirasuna et al.
(Continued)

FOREIGN PATENT DOCUMENTS

CN 101754570 A 6/2010
CN 101964295 A 2/2011
(Continued)

OTHER PUBLICATIONS

The World Intellectual Property Organization (WIPO) International Search Report for PCT/CN2022/122085 Jan. 4, 2023 5 Pages (including translation).

(Continued)

*Primary Examiner* — Samuel S Outten
(74) *Attorney, Agent, or Firm* — Anova Law Group, PLLC

(57) ABSTRACT

An impedance-matching method applied to semiconductor processing equipment includes a processing preparation step and a processing ignition step. The processing preparation step includes obtaining currently stored impedance-matching data corresponding to a processing ignition step. The impedance-matching data includes a parameter adjustment position corresponding to a parameter adjustable device in an impedance-matching device of the semiconductor processing equipment. The processing preparation step further includes adjusting a parameter value of the parameter adjustable device based on the parameter adjustment position. The processing ignition step includes applying radio frequency (RF) power to a processing chamber of the semiconductor processing equipment through the impedance-matching device, performing impedance matching through the impedance-matching device, and determining a current parameter adjustment position of the parameter adjustable device when impedance is matched, and updating the impedance-matching data based on the current parameter adjustment position.

10 Claims, 4 Drawing Sheets

(56) References Cited

U.S. PATENT DOCUMENTS

| | | | | |
|---|---|---|---|---|
| 2017/0345621 | A1 | 11/2017 | Cheng | |
| 2020/0402767 | A1 | 12/2020 | Bhutta | |
| 2021/0090859 | A1 * | 3/2021 | Bhutta | H01L 21/32136 |

FOREIGN PATENT DOCUMENTS

| | | | |
|---|---|---|---|
| CN | 102420579 | A | 4/2012 |
| CN | 105206544 | A | 12/2015 |
| CN | 107293466 | B | 5/2019 |
| CN | 112259433 | A | 1/2021 |
| CN | 112259491 | A | 1/2021 |
| CN | 113066712 | A | 7/2021 |
| CN | 113921366 | A | 1/2022 |
| KR | 20170103657 | A | 9/2017 |
| KR | 102240306 | B1 | 4/2021 |
| TW | 202022657 | A | 6/2020 |

OTHER PUBLICATIONS

The European Patent Office (EPO) The Extended European Search Report for Application No. 22874982.6 Feb. 24, 2025 9 Pages.

* cited by examiner

SEMICONDUCTOR PROCESSING EQUIPMENT AND IMPEDANCE-MATCHING METHOD

CROSS-REFERENCE TO RELATED APPLICATIONS

This application is a continuation of International Application No. PCT/CN2022/122085, filed on Sep. 28, 2022, which claims priority to Chinese Application No. 202111160966.8 filed on Sep. 30, 2021, the entire contents of both of which are incorporated herein by reference.

TECHNICAL FIELD

The present disclosure generally relates to the semiconductor technology field and, more particularly, to semiconductor processing equipment and an impedance-matching method.

BACKGROUND

The inductive-coupled plasma source is applied in etching, thin film deposition, and ion injection doping of the manufacturing field of semiconductor process equipment. The plasma reaction chamber includes an inductive coupling coil and an electrostatic chuck. In the etching field, the main principle of the inductive-coupled plasma source is as follows. RF current flows through the inductive coupling coil to generate an electromagnetic field inside the reaction chamber. The electromagnetic field excites the gas introduced into the reaction chamber to generate plasma. A bias voltage source controls the energy of ion bombardment to accelerate the plasma to reach the wafer and realize etching. The wafer is fixed on the electrostatic chuck by electrostatic adsorption.

In a typical radio frequency (RF) discharge plasma generation system, an output impedance of the RF power source is generally 50 ohms, while an equivalent impedance of the plasma reaction chamber is generally not 50 ohms. Moreover, under different processing conditions, the equivalent impedance of the plasma reaction chamber varies. According to the transmission line theory, when the output impedance of the RF power source is different from the load impedance (i.e., the equivalent impedance of the plasma reaction chamber), loss occurs in the RF power source output power, and the output efficiency cannot reach the maximum. Thus, energy is wasted, damage can be made to the RF power source, and even safety problems such as fire caused by local excessive heat can be caused. Additionally, since the value of the load impedance is related to the processing conditions for generating the plasma, in a process of using the inductively coupled plasma source, an impedance-matching device configured to automatically adjust the load impedance needs to be arranged between the RF power source and the plasma reaction chamber. The impedance-matching device can control and change the actual value of a parameter adjustable device (such as an adjustable capacitor) through a sensor and a control system inside the impedance-matching device according to the actual impedance of the plasma reaction chamber under different processing conditions. Thus, the load impedance is adjusted to 50 ohms to realize the impedance matching to avoid the above problems.

The existing impedance-matching device typically works as follows. The sensor inside the impedance-matching device monitors the current impedance value of the circuit in real-time. When the energy from the RF power source is transmitted to the impedance-matching device, the impedance-matching device controls the capacitance value of the adjustable capacitor under a preset algorithm in the impedance-matching device according to the current impedance value and phase provided by the sensor in real-time. Thus, the impedance value of the impedance-matching device and the plasma reaction chamber can be adjusted to 50 ohms to realize the impedance matching. With this operation manner, the impedance matching can be closely related to the initial capacitance value of the adjustable capacitor. If the initial capacitance value of the adjustable capacitor is not set appropriately, the impedance matching may not be realized, and the impedance matching efficiency can be low. Moreover, since internal consumable devices in the plasma reaction chamber gradually wear out during use, the impedance value can change continuously under the same processing condition. Thus, when the initial capacitance value of the adjustable capacitor is fixed, the impedance-matching process can gradually be inconsistent, which causes the impedance-matching efficiency to be lower and lower.

SUMMARY

The purpose of the present disclosure is to provide semiconductor processing equipment and an impedance-matching method to solve the problem of low impedance-matching efficiency in the existing semiconductor processing process.

To solve the above technical problem, embodiments of the present disclosure can be implemented as follows.

On an aspect, embodiments of the present disclosure provide an impedance-matching method applied to semiconductor processing equipment, including a processing preparation step and a processing ignition step. The processing preparation step includes currently stored obtaining impedance-matching data corresponding to a processing ignition step. The impedance-matching data includes a parameter adjustment position corresponding to a parameter adjustable device in an impedance-matching device of the semiconductor processing equipment. The processing preparation step further includes adjusting a parameter value of the parameter adjustable device based on the parameter adjustment position. The processing ignition step includes applying radio frequency (RF) power to a processing chamber of the semiconductor processing equipment through the impedance-matching device, performing impedance matching through the impedance-matching device, and determining a current parameter adjustment position of the parameter adjustable device when impedance is matched, and updating the impedance-matching data based on the current parameter adjustment position.

On another aspect, embodiments of the present disclosure provide semiconductor processing equipment, including a radio frequency (RF) power source, an impedance-matching device, and a processing chamber. The RF power source is configured to apply RF power to the processing chamber of the semiconductor processing equipment through the impedance matching device. The impedance-matching device includes a parameter adjustable device and a controller. The controller is configured to, in a processing preparation step, obtain currently stored impedance-matching data corresponding to a processing ignition step. The impedance-matching data includes a parameter adjustment position corresponding to the parameter adjustable device in the impedance-matching device of the semiconductor processing equipment. The controller is further configured to adjust a parameter value of the parameter adjustable device based on the parameter adjustment position, and in a processing ignition step, when applying the RF power to the processing chamber of the semiconductor processing equipment through the impedance-matching device, adjust the parameter-adjustable device to achieve impedance matching, determine a current parameter-adjustment position of the parameter adjustable device when impedance is matched, and update the impedance-matching data based on the current parameter adjustment position.

On another aspect, embodiments of the present disclosure provide impedance matching one or more processors and one or more memories electrically connected to the one or more processors. The one or more memories store a computer program. The one or more processors are configured to call and execute the computer program from the one or more memories to, in a processing preparation step, obtain impedance-matching data corresponding to a current stored processing ignition step. The impedance-matching data includes a parameter adjustment position corresponding to a parameter adjustable device in an impedance-matching device of the semiconductor processing equipment. The one or more processors are further configured to adjust a parameter value of the parameter adjustable device based on the parameter adjustment position, and in a processing ignition step, apply radio frequency (RF) power to a processing chamber of the semiconductor processing equipment through the impedance-matching device, perform impedance-matching through the impedance-matching device, and determine a current parameter adjustment position of the parameter adjustable device when impedance is matched, and update the impedance-matching data based on the current parameter adjustment position.

On another aspect, embodiments of the present disclosure provide a non-transitory computer-readable storage medium storing a computer program that, when executed by one or more processors, causes the one or more processors to, in a processing preparation step, obtain currently stored impedance-matching data corresponding to a processing ignition step. The impedance-matching data includes a parameter adjustment position corresponding to a parameter adjustable device in an impedance-matching device of the semiconductor processing equipment. The one or more processors are further configured to adjust a parameter value of the parameter adjustable device based on the parameter adjustment position, and in a processing ignition step, apply radio frequency (RF) power to a processing chamber of the semiconductor processing equipment through the impedance-matching device, perform impedance-matching through the impedance-matching device, and determine a current parameter adjustment position of the parameter adjustable device when impedance is matched, and update the impedance-matching data based on the current parameter adjustment position.

In the technical solution of embodiments of the present disclosure, in the processing preparation step, the currently stored impedance-matching data corresponding to the processing ignition steps is obtained. The impedance-matching data includes the parameter adjustment position corresponding to the parameter adjustable device in the impedance-matching device of the semiconductor process equipment. Thus, based on the parameter adjustment position, the parameter value of the parameter-adjustable device is adjusted. Since different parameter adjustment positions of the parameter adjustable device correspond to different parameter values, with the technical solution, the parameter values of the parameter adjustable device can be automatically adjusted in the processing preparation step. Furthermore, in the processing ignition step, the RF power is applied to the processing chamber of the semiconductor process equipment through the impedance-matching device. Simultaneously, the impedance matching is performed through the impedance-matching device. When impedance is matched, the current parameter adjustment position of the parameter adjustable device is determined, and the impedance-matching data is updated according to the current adjustment position. Thus, in the technical solution, when the impedance is matched in the processing ignition step, the parameter adjustment position of the impedance-matching data corresponding to the processing ignition step is continuously updated according to the parameter adjustment position of the parameter adjustable device when the impedance is matched. Thus, when the same processing ignition step is performed again, the parameter adjustable device can be accurately and automatically adjusted according to the parameter adjustment position in the impedance-matching data to feedback the parameter adjustment position in the impedance-matching data in the semiconductor processing process. Thus, the impedance matching time is greatly shortened, and the impedance matching efficiency is improved.

DETAILED DESCRIPTION OF THE EMBODIMENTS

Embodiments of the present disclosure provide semiconductor processing equipment and an impedance-matching method to address the problem of a low impedance-matching efficiency in the existing semiconductor processing process.

To facilitate those skilled in the art to better understand the technical solution of the present disclosure, the technical solution of embodiments of the present disclosure is described in detail in connection with the accompanying drawings of embodiments of the present disclosure. Apparently, the described embodiments are some embodiments of the present disclosure, not all embodiments. Based on embodiments of the present disclosure, all other embodiments obtained by those skilled in the art without creative efforts are within the scope of the present disclosure.

Often the sensor inside the impedance-matching device monitors the current impedance value of the circuit in real-time. When the energy from the RF power source is transmitted to the impedance-matching device, the impedance-matching device controls the capacitance value of the adjustable capacitor under a preset algorithm in the impedance-matching device according to the current impedance value and phase provided by the sensor in real-time. Thus, the impedance value of the impedance-matching device and the plasma reaction chamber can be adjusted to 50 ohms to realize the impedance matching.

With this method of operation, the impedance matching can be closely related to the initial capacitance value of the adjustable capacitor. If the initial capacitance value of the adjustable capacitor is not set appropriately, the impedance matching may not be realized, and the impedance matching efficiency can be low. Moreover, since internal consumable devices in the plasma reaction chamber gradually wear out during use, the impedance value can change continuously under the same processing condition. Thus, when the initial capacitance value of the adjustable capacitor is fixed, the impedance-matching process can gradually be inconsistent, which causes the impedance-matching efficiency to be lower and lower.

Figure 1:
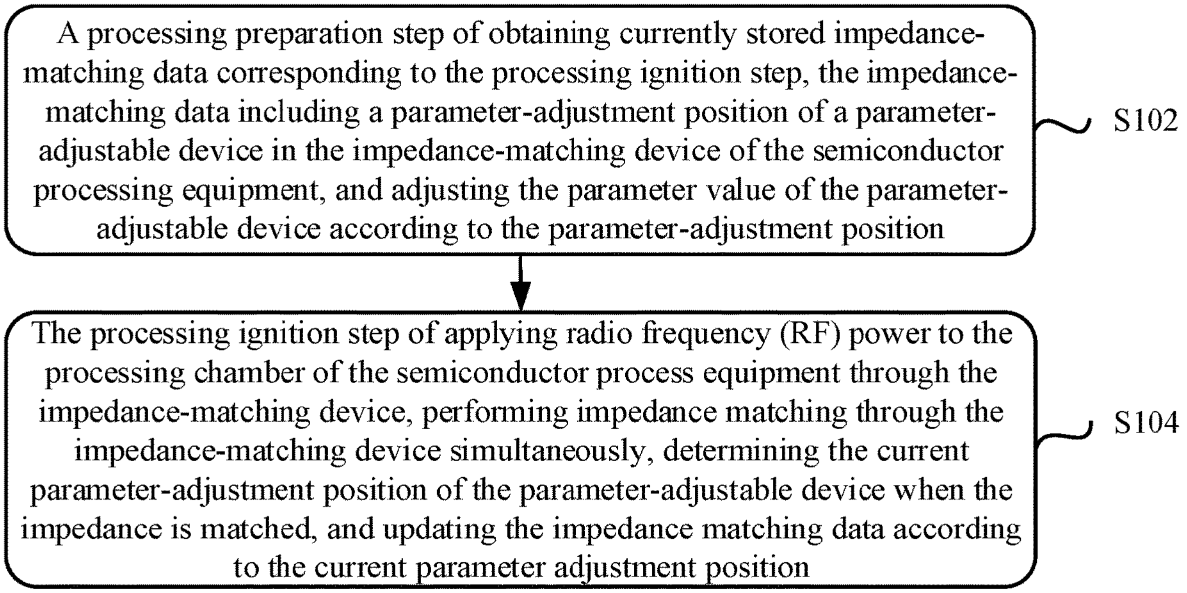
FIG. 1 illustrates a schematic flowchart of an impedance-matching method applied to semiconductor processing equipment according to an embodiment of the present disclosure.

FIG. 1 illustrates a schematic flowchart of an impedance-matching method applied to semiconductor processing equipment according to an embodiment of the present disclosure. As shown in FIG. 1, the method includes the following steps.

At S102, a processing preparation step includes obtaining currently stored impedance-matching data corresponding to the processing ignition step, the impedance-matching data including a parameter adjustment position of a parameter adjustable device in the impedance-matching device of the semiconductor processing equipment, and adjusting the parameter value of the parameter adjustable device according to the parameter adjustment position.

In the semiconductor processing, each processing step related the plasma ignition generally includes the processing preparation step and the processing ignition step. The impedance-matching data can correspond to the processing ignition step. By adjusting the parameter adjustment position of the parameter adjustable device, the parameter value of the parameter adjustment device can be adjusted. In some embodiments, the processing preparation step can be used to set the pressure of the process gas in the processing chamber, heat the temperature of the electrostatic chuck, and adjust the parameter adjustable device in the impedance-matching device. When the processing condition satisfies the requirement of the processing recipe, the method can proceed to the processing ignition step.

In some embodiments, the parameter adjustable device can include an adjustable capacitor and/or an adjustable inductor. The parameter value of the parameter adjustable device can include a capacitance value of the adjustable capacitor and an inductance value of the adjustable inductor. The parameter adjustment position of the parameter adjustable device can include a capacitance position of the adjustable capacitor, an inductance position of the adjustable inductor, etc. Different adjustment positions of the parameter adjustable device can correspond to different parameter values. That is, different capacitance positions of the adjustable capacitance device can correspond to different capacitance values, and different inductance positions of the adjustable inductor can correspond to different inductance values. For example, the parameter adjustable device can be the adjustable capacitor, the capacitance value of the adjustable capacitor can be adjusted between 50 pf to 500 pf, and the corresponding capacitance position can be from 0 to 1000. When the capacitance position is 0, the capacitance value of the adjustable capacitor can be 50 pf. When the capacitance position is 1000, the capacitance value of the adjustable capacitor can be 500 pf, and so forth. When the capacitance position changes linearly between 0 and 1000, the capacitance value of the adjustable capacitor can change linearly between 50 pf and 500 pf.

At S104, a processing ignition step includes applying radio frequency (RF) power to the processing chamber of the semiconductor process equipment through the impedance-matching device, performing impedance matching through the impedance-matching device simultaneously, determining the current parameter adjustment position of the parameter adjustable device when the impedance is matched, and updating the impedance-matching data according to the current parameter adjustment position.

Figure 4:
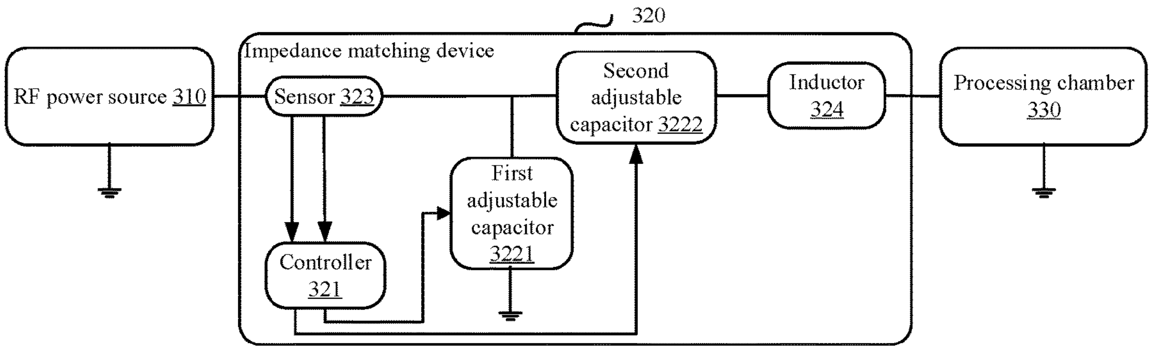
FIG. 4 illustrates a schematic block diagram of semiconductor processing equipment according to an embodiment of the present disclosure.

The principle of performing the impedance matching through the impedance-matching device is described in embodiments corresponding to FIG. 4 and in connection with the specific device inside the impedance-matching device, which is not repeated here.

In the technical solution of embodiments of the present disclosure, the currently stored impedance-matching data corresponding to the processing ignition step can be obtained in the processing preparation step. The impedance-matching data can include the parameter adjustment position corresponding to the parameter adjustment device of the impedance-matching device of the semiconductor processing equipment. Then, the parameter value of the parameter-adjustable device can be adjusted according to the parameter adjustment position. Since different parameter adjustment positions of the parameter adjustable device correspond to different parameter values, the parameter value of the parameter adjustable device can be automatically adjusted in the processing preparation step in the technical solution. Moreover, in the processing ignition step, the RF power can be applied to the processing chamber of the semiconductor processing equipment through the impedance-matching device, and the impedance matching is performed through the impedance-matching device simultaneously, and when the impedance is matched, the current parameter adjustment position of the parameter adjustable device can be determined. According to the current parameter adjustment position, the impedance-matching data can be updated. Thus, in the technical solution, when the processing ignition step achieves the impedance matching, according to the parameter adjustment position of the parameter adjustable device when the impedance is matched, the parameter adjustment position of the impedance-matching data corresponding to the processing ignition step can be continuously updated. Thus, before performing the same processing ignition step again, the parameter adjustment device can be accurately and automatically adjusted according to the parameter adjustment position of the impedance-matching data. Thus, the effect of feeding back the parameter adjustment position of the impedance-matching data can be realized in the semiconductor processing process, which greatly shortens the impedance-matching time and improves the impedance-matching efficiency.

In some embodiments, before performing S102, the semiconductor process equipment can read the current processing recipe of the semiconductor processing being currently performed to determine whether an operation mode of the impedance-matching device is Auto Preset mode (automatic preset mode) when performing processing steps of the semiconductor processing. When the operation mode of the impedance-matching device that is recorded in the processing recipe is the Auto Preset mode during performing the current processing step, S102 to S104 can be performed. The Auto Preset mode can include a manual mode and an Auto mode.

In some embodiments, the impedance-matching mode of the impedance-matching device can include an automatic matching mode and a non-automatic matching mode. In the processing preparation step, the impedance-matching device can be set to the non-automatic matching mode. In the processing ignition step, the impedance-matching device can be set to the automatic matching mode.

The non-automatic matching mode can include the manual mode, and the automatic matching mode can be the Auto mode. After the operation mode of the impedance-matching device that is recorded in the processing recipe during performing the current processing step is set to the Auto Preset mode, determining whether the current processing step is in the processing preparation step or the processing ignition step according to the RF power value recorded in the processing recipe. When the RF power value is equal to 0, the current processing step can be determined to be the processing preparation step. Then, the operation mode of the impedance-matching device can be set to the manual mode. When the operation mode of the impedance-matching device is the manual mode, the currently stored impedance-matching data corresponding to the processing ignition step can be obtained. Thus, the parameter value of the parameter-adjustable device can be adjusted according to the parameter adjustment position of the impedance-matching data corresponding to the parameter-adjustable device. It needs to be noted that, when the operation mode of the impedance-matching device is the manual mode, the impedance-matching device cannot perform automatic matching. After the parameter value of the parameter adjustable device is adjusted according to the parameter adjustment position, the parameter adjustment position of the parameter adjustable device can remain unchanged.

The semiconductor processing equipment can obtain a target learn file corresponding to the current processing step from the stored learn file (used to store the impedance-matching data) according to the identification information of the current processing step. Then, the parameter adjustment position recorded in the target learn file corresponding to the parameter adjustable device can be obtained. The identification information of the current processing step can include a name and a step number of the processing step. For example, the semiconductor processing can be etching processing. The etching processing can include deposition step 1-1, etching step 1-1, deposition step 2-1, and etching step 2-1. If the current processing step is etching step 1-1, the identification information of the processing step can be etching step 1-1.

In some embodiments, the processing steps can correspond to learn files of the processing steps, respectively. Taking the parameter adjustable device of the impedance-matching device being adjustable capacitor C1 as an example, the learn file corresponding to C1 can include the following parameters. (1) C1PresetLearned represents the matching position of C1. That is, when the impedance is matched, the capacitor position of C1. (2) C1PresetConst1 represents a predetermined recommended parameter of C1, which is a negative number. The parameter can be predetermined or obtained through experimental measurements (described in detail in subsequent embodiments), and can be used to fine-adjust the parameter adjustment positions corresponding to all processing steps in the semiconductor processing. (3) C1PresetOffset represents the predetermined position correction of C1. The parameter can be same or different for different processing steps to realize flexible fine-adjustment the parameter adjustment position corresponding to a single processing step. The parameter in the semiconductor processing process can be set to 0 or another value. (4) C1Calculate represents the predetermined position recommended value of C1. The parameter can be obtained by summing C1PresetLearned, C1PresetConst1, and C1PresetOffset.

For the semiconductor processing that is performed first, the semiconductor processing equipment can create learn files corresponding to the processing steps, respectively, according to the identification information of the processing steps in the processing recipe by reading the processing recipe of the semiconductor processing that is currently performed. Then, the parameter adjustment position recorded in the learn file corresponding to the parameter adjustable device can be set to a default value. For the semiconductor processing that is performed multiple times, the parameter adjustment position recorded in the learn file corresponding to the parameter adjustable device can be a value that is updated multiple times.

When the RF power value is greater than 0, the current processing step can be determined to be in the processing ignition step. Then, the operation mode of the impedance-matching device can be set to the Auto mode. When the operation mode of the impedance-matching device can be the Auto mode, the impedance matching can be performed through the impedance-matching device. When the impedance is matched, the current parameter adjustment position of the parameter-adjustable device can be determined. The impedance-matching data can be updated according to the current parameter adjustment position.

In some embodiments, since the impedance-matching device does not need to perform the impedance matching in the processing preparation step, the operation mode of the impedance-matching device can be adjusted to the non-automatic matching mode. Thus, the electrical energy can be saved, and the processing disturbance caused by activating the impedance-matching work in the processing preparation step can be avoided to ensure the semiconductor processing is accurately performed.

In some embodiments, the parameter adjustment position in the impedance-matching data can include a first parameter adjustment position, a parameter correction value, and a second parameter adjustment position. The second parameter adjustment position can be the sum of the first parameter adjustment position and the parameter correction value. The processing steps correspond to their parameter correction values, respectively.

In some embodiments, the first parameter adjustment position can be C1PresetLearned in the above learn file, and the parameter correction value can be C1PresetOffset in the learn file. When performing S102, the parameter value of the parameter adjustable device can be adjusted according to the second parameter adjustment position.

In some embodiments, since the parameter correction value can allow the flexible fine-adjustment of the parameter adjustment position corresponding to the corresponding processing step, the parameter value of the parameter adjustable device according to the second parameter adjustment position. Thus, the parameter value more close to the actual parameter value of the parameter adjustment device in the processing steps can be obtained. Then, the impedance-matching time can be shortened, and the impedance-matching efficiency can be improved when the impedance-matching device performs the impedance matching subsequently.

In some embodiments, when the parameter adjustment position includes the first parameter adjustment position, the parameter correction value, and the second parameter adjustment position, and S104 is performed, the first parameter adjustment position can be updated according to the current parameter adjustment position. Then, the second parameter adjustment position can be updated according to the updated first parameter adjustment position and the parameter correction value.

In some embodiments, by synchronously updating the second parameter adjustment position after updating the first parameter adjustment position, when the processing step is performed again, the parameter value of the parameter adjustable device can be adjusted according to the updated second parameter adjustment position. Thus, the parameter value of the parameter adjustable device can be more accurately adjusted to accurately and automatically adjust the parameter value of the parameter adjustable device.

Based on the above embodiments, the parameter adjustment position can further include a predetermined parameter matching value. Then, the second parameter adjustment position can be the sum of the first parameter adjustment position, the predetermined parameter matching value, and the parameter correction value. After the parameter value of the parameter adjustable device is adjusted according to the second parameter adjustment position, the impedance-matching information of the impedance-matching device can satisfy the predetermined condition. The impedance-matching information can include at least one of a total impedance-matching time length, or a difference in time lengths of the impedance matching corresponding to the processing ignition steps. The predetermined condition can include at least one of the total impedance-matching time length being minimum or the difference in the time lengths of the impedance matching corresponding to the processing ignition steps being minimum.

In some embodiments, the predetermined parameter matching value can be C1PresetConst1 in the learn file, and the second parameter adjustment position can be C1Calculate in the learn file.

In some embodiments, before performing S102, the predetermined parameter matching value when the total impedance-matching time length is minimum or the difference in the time lengths of the impedance matching corresponding to the processing ignition steps is minimum can be determined through following steps A1 to A4.

At A1, a plurality of to-be-filtered parameter matching values corresponding to the parameter adjustable device are determined.

In some embodiments, experiments can be performed using a sample processing element to determine the predetermined parameter-matching value. A plurality of sample processing elements can be selected to improve the adaptability of the predetermined parameter matching value that is finally determined. One sample processing element can be also selected to improve the speed of determining the predetermined parameter-matching value.

At A2,the parameter adjustment position of the parameter adjustable device is determined according to the second parameter adjustment positions corresponding to the plurality of to-be-filtered parameter matching values.

When the parameter adjustment position of the parameter adjustable device includes the first parameter adjustment position, the predetermined parameter matching value, and the parameter correction value, the second parameter adjustment position corresponding to a to-be-filtered parameter matching value can be the sum of the first parameter adjustment position, the to-be-filtered parameter matching value, and the parameter correction value. When the parameter adjustment position of the parameter adjustable device includes the first parameter adjustment position and the predetermined parameter matching value, the second parameter adjustment position corresponding to the to-be-filtered parameter matching value can be the sum of the first parameter adjustment position and the to-be-filtered parameter matching value.

At A3, after each time adjusting the parameter adjustment position of the parameter adjustable device, ignition is performed once, and the impedance-matching time lengths corresponding to the to-be-filtered parameter matching values can be determined.

At A4, according to the plurality of determined impedance-matching time lengths, the to-be-filtered parameter matching value corresponding to the impedance-matching time length that satisfies the predetermined condition can be determined as the predetermined parameter matching value.

In some embodiments, by using the to-be-filtered parameter matching value corresponding to the shortest total impedance-matching time length and the smallest difference in the impedance-matching time length corresponding to the processing ignition step as the predetermined parameter matching value, after adjusting the parameter adjustable device according to the second parameter adjustment position with the predetermined parameter matching value, the impedance-matching information of the impedance device can satisfy the predetermined condition when performing the impedance matching.

In some embodiments, according to the above steps A1 to A4, after conducting experiments with a large number of sample processing elements, when the parameter adjustable device of the impedance-matching device includes first adjustable capacitor C1 and second adjustable capacitor C2, C1PresetConst1=−45, and C2PresetConst2=−75, the impedance-matching device can have the shortest total impedance-matching time length and the smallest difference in the time lengths of the impedance matching corresponding to the processing ignition steps.

Figure 2:
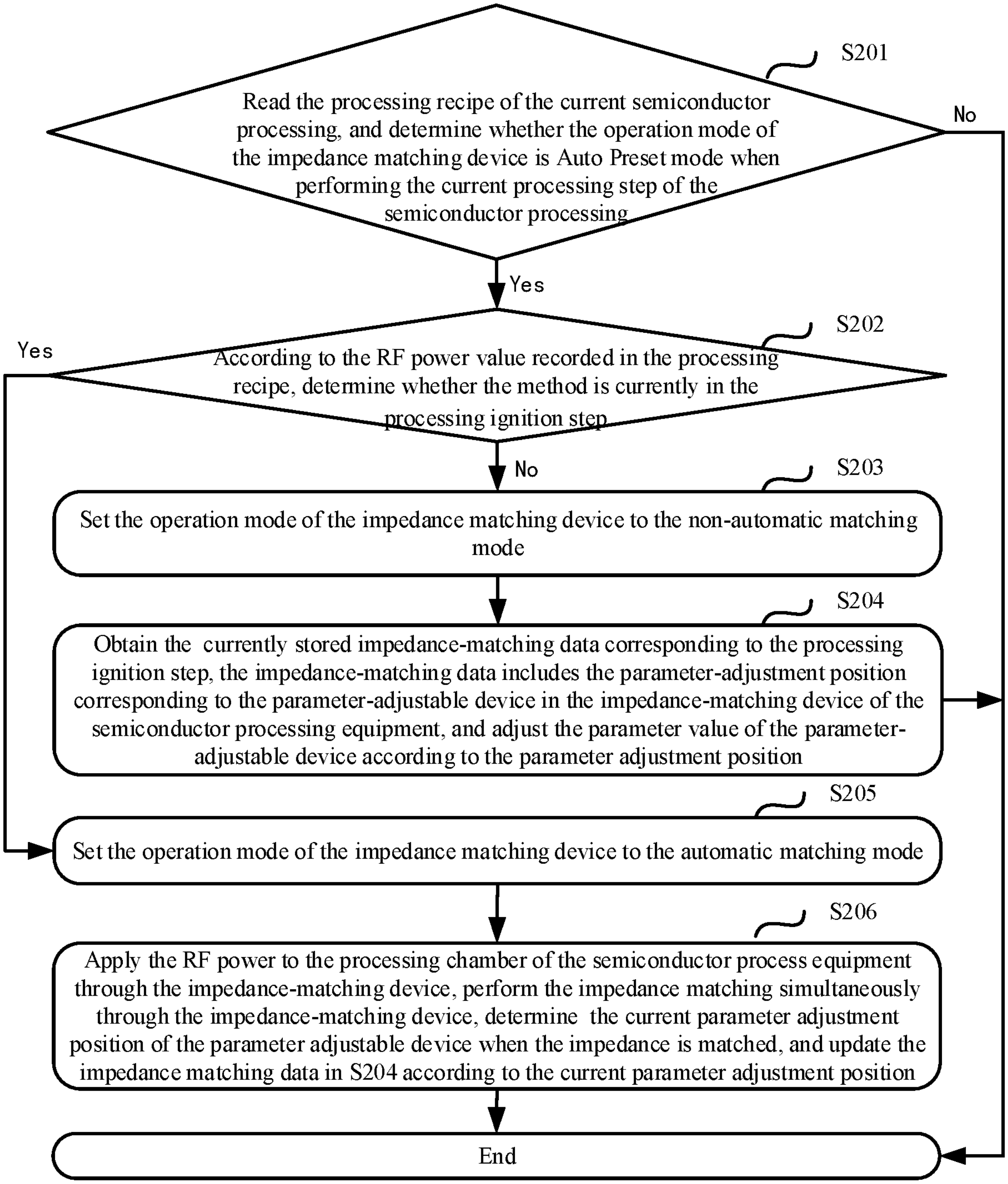
FIG. 2 illustrates a schematic flowchart of another impedance-matching method applied to semiconductor processing equipment according to an embodiment of the present disclosure.

FIG. 2 illustrates a schematic flowchart of another impedance-matching method applied to semiconductor processing equipment according to an embodiment of the present disclosure. As shown in FIG. 2, the method of FIG. 2 includes the following steps.

At S201, the processing recipe of the current semiconductor processing is read, and determine whether the operation mode of the impedance-matching device is Auto Preset mode when performing the current processing step of the semiconductor processing. If yes, S202 is performed, and if no, the process ends.

At S202, according to the RF power value recorded in the processing recipe, whether the semiconductor processing is currently in the processing ignition step is determined. If no, S203 is performed, and if yes, S205 is performed.

When the RF power value equals 0, the semiconductor processing can be determined to be currently in the processing preparation step. When the RF power value is greater than 0, the semiconductor processing can be determined to be currently in the processing ignition step.

At S203, the operation mode of the impedance-matching device is set to the non-automatic matching mode.

The non-automatic matching mode can be the manual mode.

At S204, the currently stored impedance-matching data corresponding to the processing ignition step is obtained, the impedance-matching data includes the parameter adjustment position corresponding to the parameter adjustable device in the impedance-matching device of the semiconductor processing equipment, and the parameter value of the parameter adjustable device can be adjusted according to the parameter adjustment position.

After performing S204, the process ends. Then, according to S202, when the RF power value recorded in the processing recipe is greater than 0, S205 can be performed.

In some embodiments, the parameter adjustment position can include the first parameter adjustment position, the parameter correction value, and the second parameter adjustment position. The second parameter adjustment position can be the sum of the first parameter adjustment position and the parameter correction value. When performing S204, the parameter values of the parameter adjustable device can be adjusted according to the second parameter adjustment position.

In some embodiments, the parameter adjustment position can include the first parameter adjustment position, the parameter correction value, the second parameter adjustment position, and the predetermined parameter matching value. The second parameter adjustment position can be the sum of the first parameter adjustment position, the predetermined parameter matching value, and the parameter correction value. After adjusting the parameter values of the parameter adjustable device according to the second parameter adjustment position, the total impedance-matching time length device can be minimum, and the difference in the impedance-matching time lengths corresponding to the processing ignition steps can be minimum.

At S205, the operation mode of the impedance-matching device is set to the automatic matching mode.

The automatic matching mode can be the Auto mode.

At S206, the RF power is applied to the processing chamber of the semiconductor process equipment through the impedance-matching device, the impedance matching is performed simultaneously through the impedance-matching device, the current parameter adjustment position of the parameter adjustable device is determined when the impedance is matched, and the impedance-matching data in S204 is updated according to the current parameter adjustment position. Then, the process ends.

The specific process of step S201 to S206 have been detailed in the previous embodiments and will not be repeated here.

In the technical solution of embodiments of the present disclosure, the currently stored impedance-matching data corresponding to the processing ignition step can be obtained in the processing preparation step. The impedance-matching data can include the parameter adjustment position corresponding to the parameter adjustable device in the impedance-matching device of the semiconductor processing equipment. Thus, the parameter value of the parameter-adjustable device can be adjusted according to the parameter adjustment position. Since different parameter adjustment positions of the parameter adjustable device correspond to different parameter values, the parameter value of the parameter adjustable device can be automatically adjusted in the processing preparation step in the technical solution of the present disclosure. Moreover, in the processing ignition step, the RF power can be applied to the processing chamber of the semiconductor processing equipment through the impedance-matching device, the impedance matching can be performed simultaneously through the impedance-matching device, and after the impedance is matched, the current parameter adjustment position of the parameter adjustable device can be determined. According to the current parameter adjustment position, the impedance-matching data can be updated. Thus, in the technical solution, when the impedance is matched in the processing ignition step, according to the parameter adjustment position of the parameter adjustable device when the impedance is matched, the parameter adjustment position of the impedance-matching data corresponding to the processing ignition step can be continuously updated. Thus, before performing the same processing ignition step again, the parameter adjustable device can be accurately and automatically adjusted according to the parameter adjustment position of the impedance-matching data. Thus, in the semiconductor processing process, the effect of adjusting the parameter adjustment position of the impedance-matching data can be fed back, which greatly shortens the impedance-matching time and improves the impedance-matching efficiency.

In summary, specific embodiments of the present subject matter have been described. Other embodiments are within the scope of the appended claims. In some situations, actions recorded in the claims can be performed in a different order to still achieve the desired results. Additionally, the process illustrated in the accompanying drawings does not necessarily require a specific or continuous sequence to achieve the desired results. In some embodiments, multitasking and parallel processing can be advantageous.

The above is the impedance-matching method applied to the semiconductor processing equipment of embodiments of the present disclosure. Based on the same concepts, embodiments of the present disclosure further provide semiconductor processing equipment.

Figure 3:
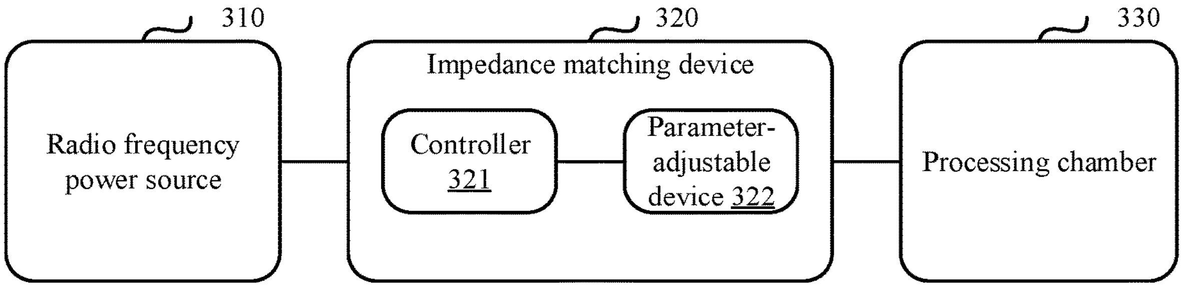
FIG. 3 illustrates a schematic structural diagram of semiconductor processing equipment according to an embodiment of the present disclosure.

FIG. 3 illustrates a schematic structural diagram of semiconductor processing equipment according to an embodiment of the present disclosure. The semiconductor process equipment includes an RF power source 310, an impedance-matching device 320, and a processing chamber 330.

The RF power source 310 can be configured to apply the RF power to the processing chamber 330 through the impedance-matching device 320.

The impedance-matching device 320 includes a controller 321 and a parameter adjustable device 322. The controller 321 can be configured to, in the processing preparation step, obtain the currently stored impedance-matching data corresponding to the processing ignition step, the impedance-matching data including the parameter adjustment position corresponding to the parameter adjustable device 322 in the impedance-matching device 320 of the semiconductor processing equipment, adjust the parameter value of the parameter adjustable device 322 according to the parameter adjustment position, adjust the parameter adjustable device 322 to achieve the impedance matching in the processing ignition step when the RF power source 310 applies the RF power to the processing chamber 330 of the semiconductor processing equipment through the impedance-matching device 320, after the impedance is matched, determine the current parameter adjustment position of the parameter adjustable device 322, and update the impedance-matching data according to the current parameter adjustment position.

In some embodiments, the operation mode of the impedance-matching device 320 includes the automatic matching mode and the non-automatic matching mode.

The controller 321 can be further configured to set the impedance-matching device 320 to non-automatic matching mode in the processing preparation step and set the impedance-matching device 320 to the automatic matching mode in the process ignition step.

In some embodiments, the parameter adjustment position can include the first parameter adjustment position, the parameter correction value, and the second parameter adjustment position. The second parameter adjustment position can be the sum of the first parameter adjustment position and the parameter correction value.

The controller 321 can be further configured to adjust the parameter value of the parameter adjustable device 322 according to the second parameter adjustment position.

In some embodiments, the controller 321 can be further configured to:

updating the first parameter adjustment position according to the current parameter adjustment position; and updating the second parameter adjustment position according to the updated first parameter adjustment position and the parameter correction value.

In some embodiments, the parameter adjustment position can further include the predetermined parameter matching value. The second parameter adjustment position can be the sum of the first parameter adjustment position, the predetermined parameter matching value, and the parameter correction value.

After adjusting the parameter adjustable device 322 according to the second parameter adjustment position, the impedance-matching information of the impedance-matching device 320 can satisfy the predetermined condition.

The impedance-matching information can include at least one of the total impedance-matching time length or the difference in the impedance-matching time lengths corresponding to the processing ignition steps.

The predetermined condition can include at least one of the total impedance-matching time length being shortest or the different in the impedance-matching time lengths corresponding to the processing ignition steps being smallest.

In some embodiments, the controller 321 can be further configured to:

determine the plurality of to-be-filtered parameter matching values corresponding to the parameter adjustable device 322;

adjust the parameter adjustment position of the parameter adjustable device 322 according to the second parameter adjustment positions corresponding to the to-be-filtered parameter matching values, respectively;

each time after adjusting the parameter adjustment position of the parameter adjustable device 322, perform ignition once and determine the impedance-matching time lengths corresponding to the to-be-filtered parameter matching values; and according to the plurality of impedance-matching time lengths, determine the to-be-filtered parameter matching value corresponding to the impedance-matching time length satisfying the predetermined condition as the predetermined parameter matching value.

In some embodiments, the controller 321 can be implemented using various hardware with processing capabilities such as a Programmable Logic Controller (PLC), a lower-level computer, an upper-level computer, or a combination thereof.

In some embodiments, the parameter adjustable device 322 can include an adjustable capacitor and/or an adjustable inductor.

In the device of embodiments of the present disclosure, in the processing preparation step, the currently stored impedance-matching data corresponding to the processing ignition step can be obtained. The impedance-matching data can include the parameter adjustment position corresponding to the parameter adjustable device in the impedance-matching device of the semiconductor processing equipment. Thus, the parameter value of the parameter-adjustable device can be adjusted according to the parameter adjustment position. Since different parameter adjustment positions of the parameter adjustable device correspond to different parameter values, the parameter value of the parameter adjustable device can be automatically adjusted in the processing preparation step using the device. Moreover, in the processing ignition step, the RF power can be applied to the processing chamber of the semiconductor processing equipment through the impedance-matching device, the impedance matching can be performed simultaneously through the impedance-matching device, and after the impedance is matched, the current parameter adjustment position of the parameter adjustable device can be determined. According to the current parameter adjustment position, the impedance-matching data can be updated. Thus, when the impedance is matched in the processing ignition step, according to the parameter adjustment position of the parameter adjustable device when the impedance is matched, the device can continuously update the parameter adjustment position of the impedance-matching data corresponding to the processing ignition step. Thus, before performing the same processing ignition step again, the device can be accurately and automatically adjusted according to the parameter adjustment position of the impedance-matching data. Thus, in the semiconductor processing process, the effect of adjusting the parameter adjustment position of the impedance-matching data can be fed back, which greatly shortens the impedance-matching time and improves the impedance-matching efficiency.

FIG. 4 illustrates a schematic block diagram of semiconductor processing equipment according to an embodiment of the present disclosure. As shown in FIG. 4, the semiconductor processing equipment includes an RF power resource 310, an impedance-matching device 320, and a processing chamber 330 that are connected in sequence.

The impedance-matching device 320 includes a sensor 323, a controller 321, and a parameter-adjustable device that are connected to each other. The sensor 323 is connected to the RF power resource 310, and connected to the processing chamber 330 through the parameter adjustable device.

The RF power source 310 and the processing chamber 330 are grounded. The parameter adjustable device includes a first adjustable capacitor 3221 and a second adjustable capacitor 3222. The first adjustable capacitor 3221 is connected in parallel between the sensor 323 and the ground, while the second adjustable capacitor 3222 is connected in series between the sensor 323 and the processing chamber 330. The first adjustable capacitor 3221 and the second adjustable capacitor 3222 are connected to the controller 321. An inductor 324 is further connected between the second adjustable capacitor 3222 and the processing chamber 330. With the inductor 324, the impedance characteristic of the impedance-matching device 320 can be consistent with the impedance characteristic of the processing chamber 330.

When the semiconductor processing equipment shown in FIG. 4 is used to realize the impedance matching, the sum of the impedance of the impedance-matching device 320 and the impedance of the processing chamber 330 collected by the sensor 323 is used as the first impedance. The first impedance can be sent to the controller 321. The controller 321 can determine the target capacitance value of the adjustable capacitor according to the difference between the first impedance and the output impedance of the RF power source 310 and transmit the target capacitance value to a capacitance control module (not shown in FIG. 4) in the adjustable capacitor. Thus, the capacitance control module can adjust the capacitance value of the adjustable capacitor to be the target capacitance value to realize the impedance matching.

It needs to be noted that devices with the same number in the semiconductor processing equipment shown in FIG. 4 and FIG. 3 can have the same function, which is not repeated to avoid repetition.

Figure 5:
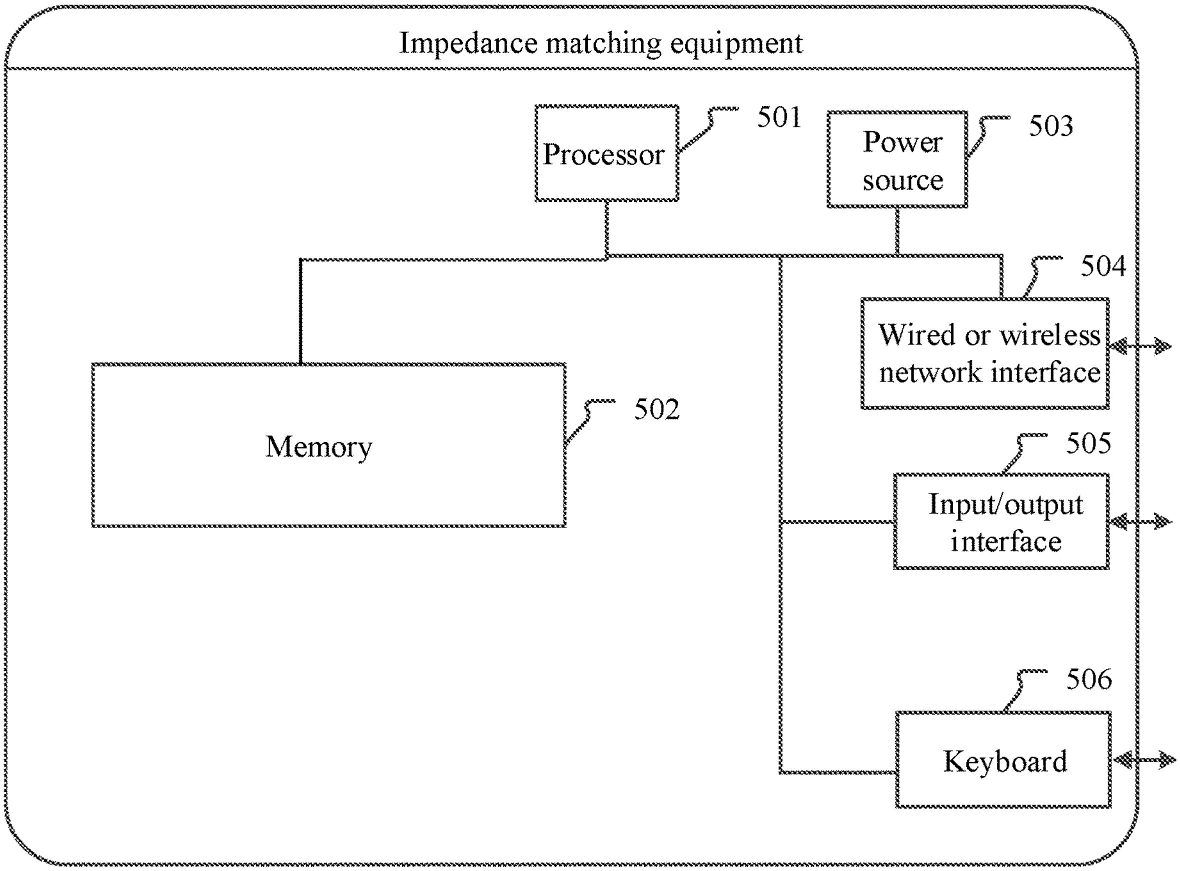
FIG. 5 illustrates a schematic structural diagram of impedance-matching equipment according to an embodiment of the present disclosure.

Based on the same concept, embodiments of the present disclosure further provide an impedance-matching equipment as shown in FIG. 5. The impedance-matching equipment can have big differences due to different configurations or performance and includes one or more processors 501 and memories 502. The memories 502 can be used to store one or more applications or pieces of data. The memories 502 can be stored either temporarily or persistently. The applications stored in the memories 502 can include one or more modules (not shown in the figure). Each module can include a series of computer-executable instructions in the impedance-matching equipment. Further, the processors 501 can be configured to communicate with the memories 502 and perform the series of computer-executable instructions in the memories 502 in the impedance-matching equipment. The impedance-matching equipment can further include one or more power sources 503, one or more wired or wireless network interfaces 504, one or more input and output interfaces 505, and one or more keyboards 506.

In some embodiments, the impedance-matching equipment can include the memories and one or more applications. The one or more applications can be stored in the memories. The one or more applications can include one or more modules. Each module can include a series of computer-executable instructions for the impedance matching equipment that, when the one or more applications are executed by the one or more processors, the following computer-executable instructions can be performed.

In the processing preparation step, the currently stored impedance-matching data corresponding to the processing ignition step can be obtained. The impedance-matching data can include the parameter adjustment position corresponding to the parameter adjustable device in the impedance-matching device of the semiconductor processing equipment. According to the parameter adjustment position, the parameter value of the parameter adjustable device can be adjusted.

In the processing ignition step, the RF power can be applied to the processing chamber of the semiconductor processing equipment through the impedance-matching device, and the impedance matching can be simultaneously performed through the impedance-matching device. After the impedance is matched, the current parameter adjustment position of the parameter-adjustable device can be determined. According to the current parameter adjustment position, the impedance-matching data can be updated.

With the equipment of embodiments of the present disclosure, in the processing preparation step, the currently stored impedance-matching data corresponding to the processing ignition step can be obtained. The impedance-matching data can include the parameter adjustment position corresponding to the parameter adjustable device in the impedance-matching device of the semiconductor processing equipment. Thus, the parameter value of the parameter-adjustable device can be adjusted according to the parameter adjustment position. Since different parameter adjustment positions of the parameter adjustable device correspond to different parameter values, the parameter value of the parameter adjustable device can be automatically adjusted in the processing preparation step using the device. Moreover, in the processing ignition step, the RF power can be applied to the processing chamber of the semiconductor processing equipment through the impedance-matching device, the impedance matching can be performed simultaneously through the impedance-matching device, and after the impedance is matched, the current parameter adjustment position of the parameter adjustable device can be determined. According to the current parameter adjustment position, the impedance-matching data can be updated. Thus, when the impedance is matched in the processing ignition step, according to the parameter adjustment position of the parameter adjustable device when the impedance is matched, the equipment can continuously update the parameter adjustment position of the impedance-matching data corresponding to the processing ignition step. Thus, before performing the same processing ignition step again, the device can be accurately and automatically adjusted according to the parameter adjustment position of the impedance-matching data. Thus, in the semiconductor processing process, the effect of adjusting the parameter adjustment position of the impedance-matching data can be fed back, which greatly shortens the impedance-matching time and improves the impedance-matching efficiency.

Embodiments of the present disclosure further provide a storage medium. The storage medium can store one or more computer programs. The one or more computer programs can include an instruction. When the instruction is executed by the electronic equipment including the plurality of applications, the electronic equipment can execute the processes of impedance matching method embodiments applied to the semiconductor processing equipment, and the same technical effect can be achieved, which is not repeated here to avoid repetition.

The system, device, module, or unit described in the above embodiments can be implemented by computer chips or physical entities, or a product having a certain function. Typical implementation equipment can be a computer. In some embodiments, the computer can include, for example, a personal computer, a laptop computer, a cellular phone, a camera phone, a smartphone, a personal digital assistant, a media player, navigation equipment, email equipment, a game console, a tablet computer, wearable equipment, or a combination thereof.

To facilitate description, when the device is described, the device can be divided into units based on functions, which can be described, respectively. Of course, when the present disclosure is implemented, functions of the units can be implemented in a same or more pieces of software and/or hardware.

Those skilled in the art should understand that embodiments of the present disclosure can provide the method, the system, or the computer program product. Thus, the present disclosure can take the form of entire hardware embodiments, entire software embodiments, or embodiments combining the software aspect and the hardware aspect. Moreover, in the present disclosure, the computer program product can be implemented by one or more computer-readable storage media (including but not limited to a magnetic disk memory, CD-ROM, an optical memory, etc.) including the computer-executable program codes.

The present disclosure can be described according to the flowcharts and/or block diagrams of the method, equipment (system), and computer program product of embodiments of the present disclosure. Each process and/or block in the flowcharts and/or block diagrams and a combination of the processes and/or blocks in the flowcharts and/or block diagrams can be implemented by the computer program instructions. The computer program instructions can be provided to a general-purpose computer, a special-purpose computer, an embedded processor, or a processor of other programmable data processing equipment to generate a machine. Thus, the instruction executed by the computer or the processor of the other programmable data processing equipment can be used to generate a device configured to implement a process of the flowchart or a function determined in one or more blocks of a plurality of processes and/or blocks.

The computer program instructions can also be stored in a computer-readable storage device that can guide the computer or the other programmable data processor equipment to operate in a specific manner. Thus, the instructions stored in the computer-readable storage device can generate a manufactured product including the instruction device. The instruction device can be implemented as a function determined in one process or more processes of the flowchart and/or one block or more blocks of the block diagram.

The computer program instructions can also be loaded on the computer or the other programmable data processing equipment. Thus, a series of operation steps can be executed on the computer or the other programmable equipment to generate the processing implemented by the computer. Then, the instruction executed on the computer or the other programmable equipment can provide a step of implementing one or more processes of the flowchart and/or the function determined in one or more blocks of the block diagram.

In a typical configuration, the computing equipment can include one or more processors (CPUs), input/ouput interfaces, network interfaces, and memories.

The memories can include non-permanent storage in the computer-readable medium, such as random access memory (RAM) and/or non-volatile memory, such as read-only memory (ROM) or flash memory. The memory can be an example of computer-readable medium.

The computer-readable medium can include both permanent and non-permanent, and removable and non-removable medium, which can store information using any method or technology. Information can be computer-readable instructions, data structures, program modules, or other data. The computer storage medium can include, but is not limited to, for example, phase-change memory (PRAM), static random-access memory (SRAM), dynamic random-access memory (DRAM), other types of random-access memory (RAM), read-only memory (ROM), electrically erasable programmable read-only memory (EEPROM), flash memory, or other memory technologies, read-only optical discs (CD-ROM), digital versatile discs (DVD), or other optical storage, magnetic cassettes, tape magnetic disk storage, or other magnetic storage devices or any other non-transmission media, which can be used to store information accessed by the computer. According to the definition in this document, the computer-readable medium does not include transitory media, such as modulated data signals and carrier waves.

It should also be noted that the terms "comprising," "including," or any other variants thereof are intended to cover non-exclusive inclusion, allowing processes, methods, goods, or equipment comprising a series of elements to include not only those elements but also include other elements not explicitly listed, or further include the elements inherent to such processes, methods, goods, or equipment. When there is no further limitation, elements defined by the phrase "comprising a . . . " do not exclude additional identical elements present in the processes, methods, goods, or equipment including the elements.

The present disclosure can be described in a general context of computer-executable instructions, such as program modules, executed by the computer. In general, the program modules can include routines, programs, objects, components, data structures, etc., that perform specific tasks or implement specific abstract data types. The present disclosure can also be practiced in distributed computing environments where tasks are performed by remote processing equipment connected via communication networks. In such distributed computing environments, the program modules can be located in both local and remote computer storage media, including storage devices.

Embodiments described in this specification are described in a progressive manner. Same or similar parts among the embodiments can be referred to each other. Each embodiment focuses on the aspects that differ from other embodiments. Particularly for system embodiments, since the system embodiments are basically similar to method embodiments, the description can be simple. For the related parts, reference can be made to the description of the method embodiments.

The above are some embodiments of the present disclosure, which are not used to limit the present disclosure. For those skilled in the art, various modifications and changes can be made to the present disclosure. Any modification, equivalent replacement, and improvement made within the spirit and principle of the present disclosure are within the scope of the present disclosure.

What is claimed is:

1. An impedance-matching method applied to semiconductor processing equipment comprising:

a processing preparation step including obtaining currently stored impedance-matching data corresponding to a processing ignition step, the impedance-matching data including a parameter adjustment position corresponding to a parameter adjustable device in an impedance-matching device of the semiconductor processing equipment, and adjusting a parameter value of the parameter adjustable device based on the parameter adjustment position, wherein for semiconductor processing that is performed multiple times, the currently stored impedance-matching data is a value that is updated multiple times; and the processing ignition step including applying radio frequency (RF) power to a processing chamber of the semiconductor processing equipment through the impedance-matching device, performing impedance matching through the impedance-matching device, and determining a current parameter adjustment position of the parameter adjustable device when impedance is matched, and updating the impedance-matching data based on the current parameter adjustment position, wherein the processing preparation step is performed prior to applying the RF power to the processing chamber, zero RF power is applied to the processing chamber during the processing preparation step, and the impedance-matching data updated during the processing ignition step is persistently stored for retrieval in a subsequent processing preparation step prior to applying the RF power to the processing chamber again.

2. The method according to claim 1, wherein:

the parameter adjustment position includes a first parameter-adjustment position, a parameter correction value, and a second parameter-adjustment position;

the second parameter-adjustment position is a sum of the first parameter-adjustment position and the parameter correction value; and adjusting the parameter value of the parameter-adjustable device based on the parameter adjustment positions includes:

adjusting the parameter value of the parameter adjustable device based on the second parameter adjustment position.

3. The method according to claim 2, wherein updating the impedance-matching data based on the current parameter adjustment position includes:

updating the first parameter adjustment position based on the current parameter adjustment position; and updating the second parameter adjustment position based on the updated first parameter adjustment position and the parameter correction value.

4. The method according to claim 1, wherein:

the parameter adjustment position includes a first parameter-adjustment position, a predetermined parameter matching value, a parameter correction value, and a second parameter-adjustment position;

the second parameter adjustment position is a sum of the first parameter adjustment position, the predetermined parameter matching value, and the parameter correction value;

adjusting the parameter value of the parameter-adjustable device based on the parameter adjustment positions includes adjusting the parameter value of the parameter adjustable device based on the second parameter adjustment position;

after adjusting the parameter value of the parameter adjustable device according to the second parameter adjustment position, the impedance-matching information of the impedance-matching device satisfies a predetermined condition;

the impedance-matching information includes at least one of a total impedance-matching time length, or a difference in impedance-matching time lengths corresponding to processing ignition steps; and the predetermined condition includes at least one of the total impedance-matching time length being shortest, or the difference in the impedance-matching time lengths corresponding to the processing ignition steps being minimum.

5. The method according to claim 4, further comprising:

determining a plurality of to-be-filtered parameter matching values corresponding to the parameter adjustable device;

adjusting the parameter adjustment position of the parameter adjustable device according to the second parameter adjustment position corresponding to the plurality of to-be-filtered parameter matching values;

each time after adjusting the parameter adjustment position of the parameter adjustable device, performing ignition once and determining the impedance-matching time lengths corresponding to the to-be-filtered parameter matching values; and determining a to-be-filtered parameter matching value corresponding to the impedance-matching time length that meets the predetermined condition as the predetermined parameter matching value according to the plurality of impedance-matching time lengths.

6. The method according to claim 1, wherein:

an operation mode of the impedance-matching device includes an automatic matching mode and a non-automatic matching mode;

in the processing preparation step, the impedance-matching device is set to the non-automatic matching mode; and in the processing ignition step, the impedance-matching device is set to the automatic matching mode.

7. The method according to claim 1, wherein the parameter adjustable device includes an adjustable capacitor and/or an adjustable inductor.

8. Semiconductor processing equipment comprising a radio frequency (RF) power source, an impedance matching device, and a processing chamber, wherein:

the RF power source is configured to apply RF power to the processing chamber of the semiconductor processing equipment through the impedance matching device; and the impedance-matching device includes:

a parameter adjustable device; and a controller configured to, in a processing preparation step, obtain currently stored impedance-matching data corresponding to a processing ignition step, the impedance-matching data including a parameter adjustment position corresponding to the parameter adjustable device in the impedance-matching device of the semiconductor processing equipment, adjust a parameter value of the parameter adjustable device based on the parameter adjustment position, wherein for semiconductor processing that is performed multiple times, the currently stored impedance-matching data is a value that is updated multiple times, and in a processing ignition step, when applying the RF power to the processing chamber of the semiconductor processing equipment through the impedance-matching device, adjust the parameter-adjustable device to achieve impedance matching, determine a current parameter-adjustment position of the parameter adjustable device when impedance is matched, and update the impedance-matching data based on the current parameter adjustment position, wherein the processing preparation step is performed prior to applying the RF power to the processing chamber, zero RF power is applied to the processing chamber during the processing preparation step, and the impedance-matching data updated during the processing ignition step is persistently stored for retrieval in a subsequent processing preparation step prior to applying the RF power to the processing chamber again.

9. The semiconductor processing equipment according to claim 8, wherein:

an operation mode of the impedance-matching device includes an automatic matching mode and a non-automatic matching mode; and the controller is further configured to:

in the processing preparation step, set the impedance-matching device to the non-automatic matching mode; and in the processing ignition step, set the impedance-matching device to the automatic matching mode.

10. The semiconductor processing equipment according to claim 8, wherein:

the parameter adjustment position includes a first parameter adjustment position, a parameter correction value, and a second parameter adjustment position;

the second parameter adjustment position is a sum of the first parameter adjustment position and the parameter correction value; and the controller is further configured to adjust the parameter value of the parameter adjustable device based on the second parameter adjustment position.

* * * * *